United States Patent [19]
Aoki et al.

[11] Patent Number: 4,939,021
[45] Date of Patent: Jul. 3, 1990

[54] MULTILAYER CERAMIC COPPER CIRCUIT BOARD

[75] Inventors: Shigenori Aoki; Yoshihiko Imanaka, both of Atsugi, Japan

[73] Assignee: Fujitsu Limited, Kawasaki, Japan

[21] Appl. No.: 352,714

[22] Filed: May 12, 1989

Related U.S. Application Data

[63] Continuation of Ser. No. 110,254, Oct. 20, 1987, abandoned.

[30] Foreign Application Priority Data

Oct. 23, 1986 [JP] Japan .................................. 61-250755

[51] Int. Cl.$^5$ ................................................. B32B 9/00
[52] U.S. Cl. .................................... 428/209; 428/433; 428/457; 428/469; 428/901; 501/5; 501/32; 174/258; 361/397
[58] Field of Search .................. 501/5, 32; 156/89; 264/58; 428/137, 209, 210, 433, 457, 469, 901, 428; 174/68.5; 361/397

[56] References Cited

U.S. PATENT DOCUMENTS

| | | | |
|---|---|---|---|
| 4,490,429 | 12/1984 | Tosaki et al. | 428/195 |
| 4,642,148 | 2/1987 | Kurihara et al. | 156/89 |
| 4,654,095 | 3/1987 | Steinberg | 156/89 |
| 4,655,864 | 4/1987 | Rellick | 156/89 |
| 4,662,215 | 5/1987 | Eckert | 73/644 |

FOREIGN PATENT DOCUMENTS

| | | |
|---|---|---|
| 0163548 | 12/1985 | European Pat. Off. |
| 0186550 | 7/1986 | European Pat. Off. |
| 0196035 | 10/1986 | European Pat. Off. |
| 0196036 | 10/1986 | European Pat. Off. |

Primary Examiner—Patrick Ryan
Attorney, Agent, or Firm—Armstrong, Nikaido, Marmelstein, Kubovcik & Murray

[57] ABSTRACT

A multilayer ceramic copper circuit board was produced by forming a multilayer structure comprising layers of copper-based paste patterns and layers of glass/ceramic composite. The glass-ceramic consisted of a mixture of 3% to 75% by weight of mullite, 25% to 97% by weight of borosilicate glass having a softening temperature of at least 720° C., and 0% to 72% by weight of quartz glass, based on the total weight of the glass/ceramic composite, and blended with a binder composition containing a thermally depolymerizable resin. The multilayer structure was prefired in an inert atmosphere containing water vapor and having a partial pressure of 0.005 to 0.3 atmosphere, at a temperature at which the thermally depolymerizable resin was eliminated, the multilayer structure was then fired in an inert atmosphere containing no water vapor at a temperature below the melting temperature of copper, to sinter the glass/ceramic composite.

1 Claim, 5 Drawing Sheets

MULTILAYER CERAMIC COPPER CIRCUIT BOARD

This application is a continuation of application Ser. No. 110,254 filed Oct. 20, 1987 now abandoned.

BACKGROUND OF THE INVENTION

1. Field of the Invention

The present invention relates to a multilayer ceramic copper circuit board, more particularly to a circuit board comprising a glass/ceramic composite having a low dielectric constant and a low thermal expansion coefficient, and copper conductors having a low electrical resistivity.

2. Description of the Related Art

A multilayer circuit board comprises layers of electrical insulators, usually ceramic, and metallic conductors. The ceramic must have a low dielectric constant, to enable a high-speed transmission of signals, and a thermal expansion coefficient nearly as low as that of silicon chips mounted on the ceramic board, to withstand temperature changes during the operation, as well as other desirable electrical and mechanical properties.

Previously, a multilayer circuit board was produced from a high melting point metal, e.g., molybdenum or tungsten, and a ceramic, e.g., a sintered alumina $Al_2O_3$. However, alumina has a high dielectric constant of 9.9 and a high thermal expansion coefficient of $6.8 \times 10^{-6}/°C.$, and thus it is well known to replace the alumina with other oxides, e.g., silica, quartz glass, and mullite. Mullite $3Al_2O_3 \cdot SiO_2$ has a dielectric constant of 6.5 and a thermal expansion coefficient of $4.0 \times 10^{-6}/°C.$, which is nearly equal to the $3.5 \times 10^{-6}/°C.$ of a silicon chip mounted on the ceramic board.

Recently, copper has been used for the conductors, because of the low electrical resistivity and price thereof. In this case, during the firing of the multilayer board, the copper must not be oxidized, but the organic binder included in the ceramic compositions must be eliminated without leaving residual carbon. If the matrix glass softens before the binder is completely burnt out, residual carbon is trapped in closed holes in which water vapor is present. The carbon then reacts with the water to generate carbon dioxide gas. This causes a bloating of the glass/ceramics composites, and reduces the mechanical strength thereof.

To avoid such defects, thermally depolymerizable resins are commonly used as the binder of the ceramic composition, since they can be thermally decomposed into low-molecular weight species, and thus are easily removed at a relatively low firing temperature.

Borosilicate glass has a dielectric constant of 4.0 to 4.9 and a thermal expansion coefficient of 3.2 to $4.6 \times 10^{-6}/°C.$ and, therefore, is commonly used as the matrix of the glass/ceramic composite structure. However, borosilicate glass has a tendency to precipitate cristobalite $SiO_2$ when the glass is fired at a temperature below the melting point of copper. Cristobalite has a thermal expansion coefficient of about $50 \times 10^{-6}/°C.$, which is more than ten times the $3.5 \times 10^{-6}/°C.$ of silicon, and thus causes damage to the silicon semiconductor devices due to thermal changes during the operation.

It is known that alumina can prevent the precipitation of cristobalite from borosilicate glass, and that quartz glass $SiO_2$ has a low dielectric constant of 3.8, which will compensate the high dielectric constant of 9.9 of alumina.

In U.S. Pat. No. 4,642,148, K. Kurihara et al to Fujitsu disclose a method for producing a multilayer ceramic circuit board including the steps of forming a multilayer structure consisting of patterns of copper-based paste and glass/ceramic composite layers, the glass/ceramic composite layers consisting of a mixture of 10 percent to 75 percent by weight of α-alumina, 20 percent to 60 percent by weight of crystallizable or noncrystallizable glass which can be sintered at a temperature lower than the melting point of copper, and 5 percent to 70 percent by weight of quartz glass, based on the total weight of the glass/ceramic composite, blended with a binder containing a thermally depolymerizable resin; prefiring the multilayer structure in an inert atmosphere containing water vapor, the partial pressure of which is 0.005 to 0.3 atmosphere, at a temperature at which the thermally depolymerizable resin is eliminated; and firing the multilayer structure in an inert atmosphere containing no water vapor at a temperature below the melting point of copper so as to sinter the glass/ceramic composite. The prefiring may comprise a first prefiring step at 350° C. to 450° C. and a second prefiring step at 650° C. to 900° C., and the firing is carried out at a temperature higher than 900° C. and lower than 1083° C.

In U.S. Pat. No. 4,654,095, to du Pont, referred to as the basis of a priority application of Japanese Unexamined Patent Publication No. 61-220203 laid open on Sept. 30, 1986, J. I. Steinberg discloses a dielectric composition, which comprises 50% to 75% by weight of a noncrystallizable glass having a softening temperature of 630° C. to 700° C., the difference in the softening temperature and the deforming temperature being 50° to 70° C., and 50% to 25% by weight of a refractory, which is substantially insoluble in the glass at 825° to 900° C. The refractory and glass solids may be selected from $Al_2O_3$, mullite, cordierite, $SiO_2$, $CaZrO_3$, forsterite, ZrO and mixtures thereof.

However, in all of the Examples, Steinberg teaches that a refractory oxide or oxides were sintered with a lead aluminum silicate type glass, and in Example 3, that mullite was used as the refractory to form ceramic green tapes, which were laminated and fired at 350° C. for 40 minutes, and subjected to a 90 minute heating cycle with a peak temperature of 850° C. for 15 minutes in air, and that the fired ceramic exhibited practically no deformation and had a dielectric constant of 6.5 at 1 kHz. Steinberg also teaches in Example 4 that a lead aluminum barium silicate glass having a softening temperature of 715° C. produced severely bowed sintered laminated parts.

In U.S. Pat. No. 4,655,864 to du Pont, referred to as the basis of a priority application of Japanese Unexamined Patent Publication No. 61-220204 laid open on Sept. 30, 1986, J. R. Rellick discloses a dielectric composition which comprises 40% to 70% by volume of a noncrystallizable glass having a softening temperature of at least 500° C., and a viscosity of $1 \times 10^6$ poises or less at 825° to 1025° C.; and 60% to 30% by volume of a mixture of refractory oxides comprising 1% to 59% by volume of $Al_2O_3$, and 59% to 1% by volume of a secondary refractory selected from α-quartz, $CaZrO_3$, and fused silica, which is 20% by volume, on the basis of the total inorganic solids.

Rellick teaches in Example 1 that a ceramic green tape which comprises a lead calcium aluminum silicate glass, quartz and alumina was laminated on an alumina substrate with a prefired copper paste printed thereon, and was subjected to cycle firing for 1 hour with a peak temperature of 900° C. for 10 minutes in nitrogen, and that the obtained ceramic exhibited a dielectric constant of 6.5 to 7.5 at 1 kHz and no deformation.

It is noted that Steinberg teaches the use of mullite and $SiO_2$ with a noncrystallizable glass, which has a softening temperature in the range of 630° to 700° C., and that Rellick teaches the use of a mixture of refractory oxides, i.e., $Al_2O_3$, as an essential component of a first refractory and second refractories which may be fused silica and mullite with a noncrystallizable glass, which has a softening temperature of at least 500° C., but a glass having a higher softening temperature is not discussed.

SUMMARY OF THE INVENTION

An object of the present invention is to provide a multilayer ceramic copper circuit board with a ceramic having a low thermal expansion coefficient.

Another object of the present invention is to provide a multilayer ceramic copper circuit board with a ceramic having a low dielectric constant.

Yet another object of the present invention is to provide a multilayer ceramic copper circuit board having a very small amount of residual carbon derived from the binder in the ceramic.

According to the present invention, a multilayer ceramic copper circuit board is provided, which comprises layers of a copper conductor pattern and layers of a glass/ceramic composite sintered mixture of 3% to 75% by weight of mullite, 25% to 97% by weight of borosilicate glass, which has a softening temperature of at least 720° C., and 0% to 72% by weight of quartz glass, based on the total weight of the glass/ceramic composite.

The multilayer ceramic copper circuit board according to the present invention is produced by the steps of: forming a multilayer structure comprising layers of copper-based paste patterns and layers of glass/ceramic composite, the glass-ceramic consisting of a mixture of 3% to 75% by weight of mullite, 25% to 97% by weight of borosilicate glass, which has a softening temperature of at least 720° C., and 0% to 72% by weight of quartz glass, based on the total weight of the glass/ceramic composite, blended with a binder composition containing a thermally depolymerizable resin; prefiring the multilayer structure in an inert atmosphere containing water vapor, the partial pressure of which is 0.005 to 0.3 atmosphere, at a temperature at which the thermally depolymerizable resin is eliminated; and firing the multilayer structure in an inert atmosphere containing no water vapor at a temperature below the melting temperature of copper so as to sinter the glass/ceramic composite.

BRIEF EXPLANATION OF THE DRAWINGS

The present invention will be described in more detail below with reference to the appended drawings, in which.

DESCRIPTION OF THE PREFERRED EMBODIMENTS

Figure 1:
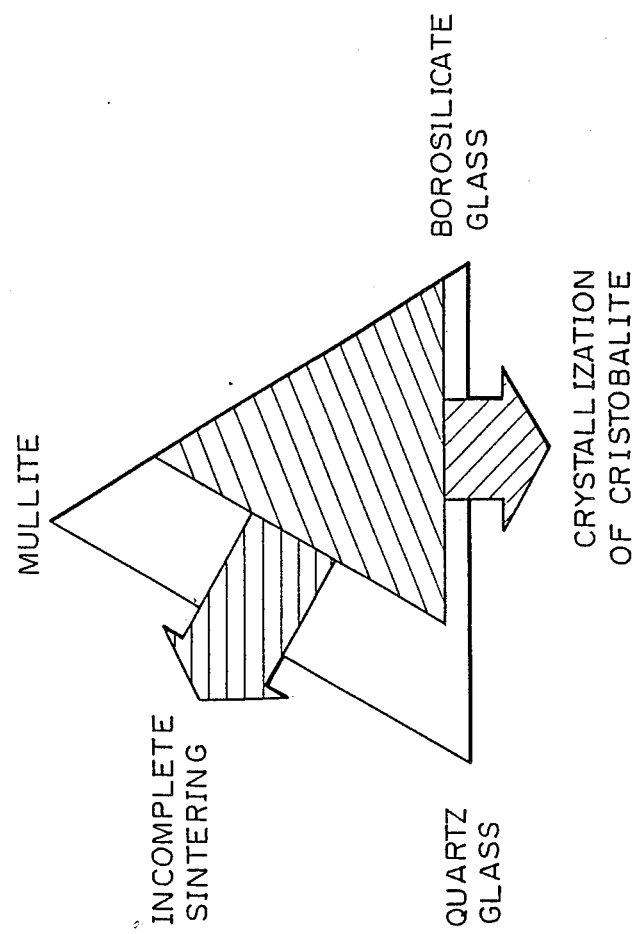
FIG. 1 is a phase diagram of a sintered glass/ceramic composite mixture of mullite, quartz-glass and borosilicate glass.

The hatched area in FIG. 1 shows the composition of the glass/ceramic composite according to the present invention.

An amount of less than 3% by weight of mullite can not prevent a precipitation of cristobalite from the borosilicate glass during firing, and an amount of more than 75% by weight of the sum of the mullite and the quartz glass, which corresponds to less than 25% by weight of the borosilicate glass, will cause an insufficient sintering, leaving small pores among the particles of mullite and quartz glass. An amount of more than 97% by weight of borosilicate glass may results in a reduction of the amount of mullite to less than 3%, which causes the defects set forth above.

Figure 4:
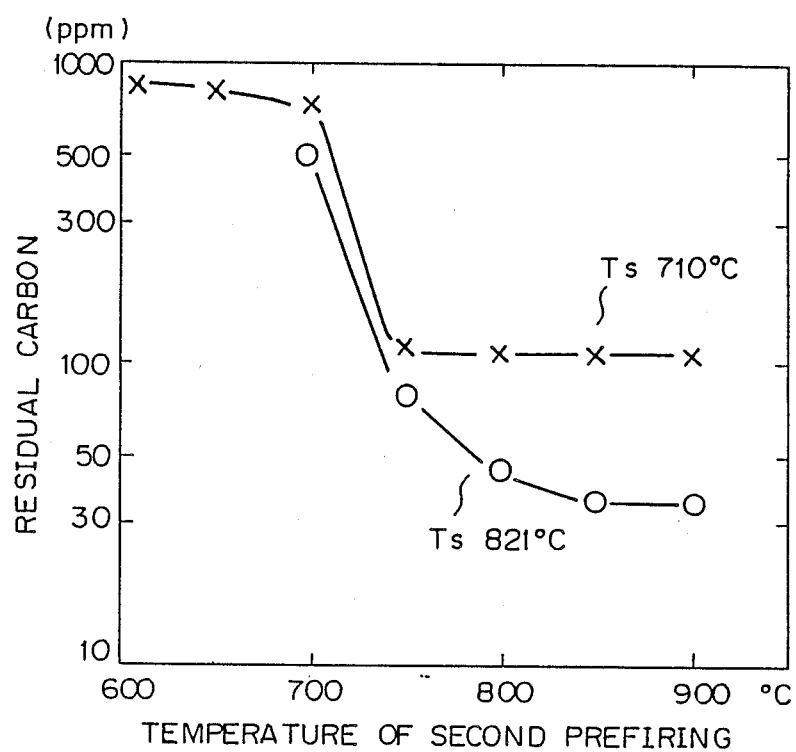
FIG. 4 is a graph showing the relationship between the second prefiring temperature and the amount of residual carbon in the glass/ceramic composite of mullite, quartz glass and borosilicate glasses having softening temperatures of 710° and 821° C., respectively; and, FIG. 5 is a graph showing the relationship between the amount of residual carbon and the dielectric strength of the glassceramic.

Borosilicate glass having a softening temperature lower than 720° C. can not sufficiently eliminate the binder even at a relatively high temperature of 750° to 900° C., during the second prefiring, as shown by the line Ts 710° in FIG. 4. We have found that residual carbon is easily trapped in a matrix of borosilicate glass having a low softening temperature.

Quartz glass has a low dielectric constant 3.8, but does not effectively prevent a precipitation of crystobalite, and therefore, it is not essential to include quartz glass as a component of the glass/ceramic composite.

The binder must be eliminated by firing in an inert atmosphere containing 0.005 to 0.3 atmosphere of water vapor. A less than 0.005 atmosphere of water can not effectively burn out the residual carbon, and more than 0.3 atmosphere of water will increase the formation of small pores in the glass/ceramic composite structure, thus reducing the strength thereof.

The prefiring may be carried out in two steps: a first prefiring at 350° to 450° C., to decompose the organic binder into fragments which are easily evaporated, and a second prefiring at 750° to 900° C. to burn out the residual carbon.

The prefired glass-ceramic structure can be finally fired at a temperature higher than 900° C. and lower than 1083° C., i.e., the melting temperature of copper, to completely sinter the glass/ceramic composite board.

To effectively eliminate the binder, during the first prefiring, a thermally decomposable binder must be used, which may be polymethacrylate esters, polytetrafluoroethylene, poly-α-methylstyrene, or a mixture thereof.

The multilayer structure may be formed by a laminated green sheet technique or a multilayer screen printing technique.

EXAMPLE 1a

To demonstrate that a glass/ceramic composite which contains mullite makes the dielectric constant and thermal expansion coefficient of a glass/ceramic composite lower than a glass/ceramic composite which contains alumina, the following glass/ceramic composite structure was produced.

Powder of 2 to 34 parts by weight of mullite (Taiheiyo Randamu K.K. 70 N 4000 F), 65 to 33 parts by weight of quartz glass (Corning 7913), and 33 parts by weight of borosilicate glass (Corning 7740) comprising 80% by weight of $SiO_2$, 14% by weight of $B_2O_3$, 2% by weight of $Al_2O_3$, and 2% by weight of $Na_2O$, and having a softening temperature of 821° C., was mixed to prepare a glass/ceramic composite mixture.

Ten parts by weight of polymethyl methacrylate as the binder, 5 parts by weight of dibutyl phthalate as a plasticizer, and 110 parts by weight of methyl ethyl ketone as a solvent were blended into the glass/ceramic composite mixture in a ball mill, to prepare a uniform glass/ceramic composite composition. A green sheet 300 μm thick was formed by a doctor-blade technique and stamped to form ten 150 mm square green sheets. Layers of these ten green sheets were sequentially laminated and pressed at 130° C. under 30 MPa.

This laminated structure was fired in a nitrogen atmosphere containing 0.07 atm of water vapor, at 400° C. for 4 hours, as the first prefiring step, to thermally depolymerize polymethyl methacrylate and remove evaporable organic substances, and then the temperature was raised to 850° C. and held for 4 hours, as the second prefiring step, to substantially eliminate the residual carbon. Then, the prefired glass/ceramic composite structure was finally fired in dry nitrogen at 1000° C. for 4 hours, to obtain a sintered glass/ceramic composite body. The sintered glass/ceramic composite body was cut to form a 50×50×2 mm test piece, on which an organic conductor paste (Fujikura Densen K.K.) was screen-printed and dried at 150° C. for 30 minutes, to form electrodes for measuring the dielectric constant.

In accordance with JIS K 6911, the dielectric constant of the test piece at 1 MHz was determined at room temperature by a capacitance bridge (Hewlett Packard Ltd., 4720 A). The amount of the dielectric constant of the glass/ceramic composite bodies was plotted in a line indicated as M in FIG. 2.

EXAMPLE 2a

A glass/ceramic composite body, sintered in the same way as in Example 1a, was cut to form 50×2.0×2.0 mm strips. The thermal expansion coefficient of the strips was measured by a push-rod type thermal expansion meter (Tokyo Industries Inc. Dilatronc) in a temperature range of room temperature to 300° C., using a quartz glass strip as a standard.

Figure 3:
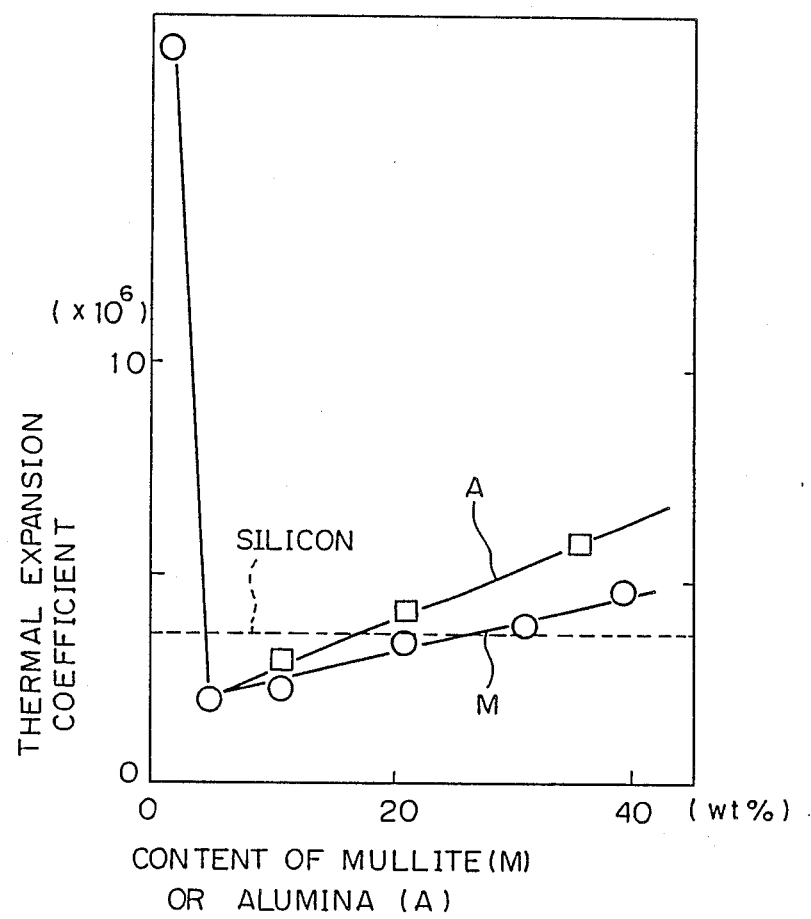
FIG. 3 is a graph showing the relationship between the thermal expansion coefficient and the content of mullite or alumina in the glass/ceramic composite formed with quartz and borosilicate glass.

The amount of thermal expansion coefficient was plotted in a line indicated as M in FIG. 3.

EXAMPLE 1b

Other glass/ceramic composite samples were produced in the same way as in Example 1a, except that alumina was used instead of mullite, and the weight of the alumina and the quartz glass were changed to 5 to 34 parts and 62 to 33 parts, respectively.

Figure 2:
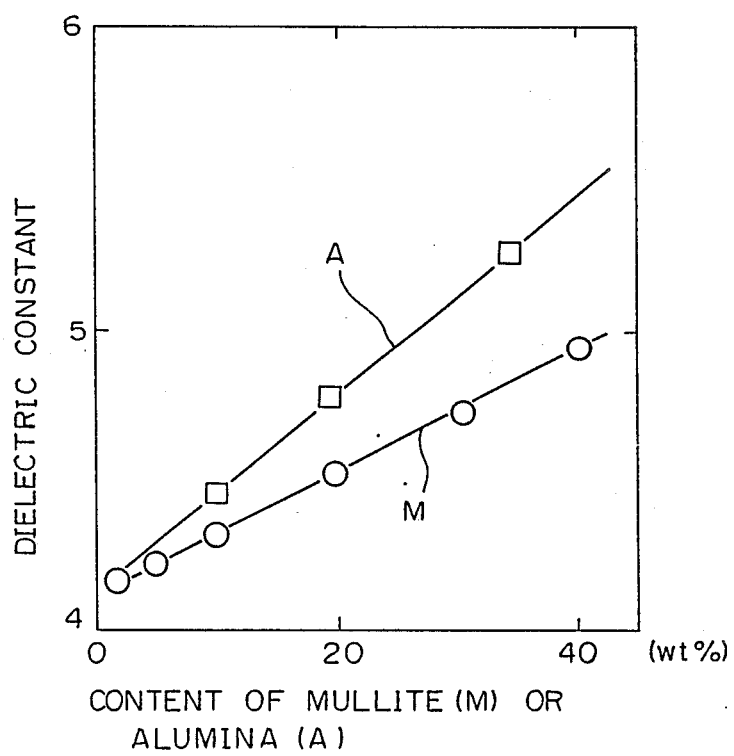
FIG. 2 is a graph showing the relationship between the dielectric constant and the content of mullite or alumina in the glass/ceramic composite formed with quartz glass and borosilicate glass.

The amount of the dielectric constant was plotted in a line indicated as A in FIG. 2, and is higher than that indicated by a line M of Example 1a.

EXAMPLE 2b

Glass/ceramic composite samples were produced in the same way as in Example 1b, except that strips 50×2.0×2.0 mm were cut from the sintered body, and the thermal expansion coefficient of the strips was measured in the same way as in Example 2a.

The amount of thermal expansion coefficient was plotted in a line indicated as A in FIG. 3, and is higher than that indicated by the line M of Example 2a.

EXAMPLE 3a

A glass/ceramic composite structure was produced in the same way as in Example 1a, except that the glass/ceramic composite composition was 5.8 parts by weight of mullite (Taiheiyo Randamu K.K. 70 N 4000 F), 56.7 parts by weight of quartz glass (Corning 7913), and 37.5 parts by weight of borosilicate glass (Corning 7740), and that after the first prefiring at 400° C. for 4 hours, the second pre-firing was carried out in a temperature range of 700° C. to 900° C. for 4 hours, and the final firing was carried out at 1030° C. for 4 hours.

The sintered glass/ceramic composite structure was ground to form a powder, and the concentration of residual carbon was determined by a carbon analyzer (LECO Ltd., WR 112), in which residual carbon is transformed to carbon dioxide, and then the heat conductivity of the evolved gas was measured, and the concentration of carbon dioxide was determined by a heat conductivity meter.

The amount of residual carbon was calculated therefrom, and plotted as shown by a line Ts 821° C. in FIG. 4. The amount of residual carbon was under 100 ppm at 750° C. in the second prefiring.

EXAMPLE 3b

Another glass/ceramic composite structure was produced in the same way as in Example 3a, except that a borosilicate glass (Corning 7070) having a softening temperature of 710° C. was used, and the second prefiring was carried out in a temperature range of 600° to 900° C. for 4 hours, and the final firing was carried out at 970° C. for 4 hours. The amount of residual carbon was measured in the same way as in Example 3a, and plotted as shown by the line Ts 710° C. in FIG. 4. Note, the amount does not decrease to less than 100 ppm at 750° C., or at 900° C., in the second prefiring.

EXAMPLE 4

Figure 5:
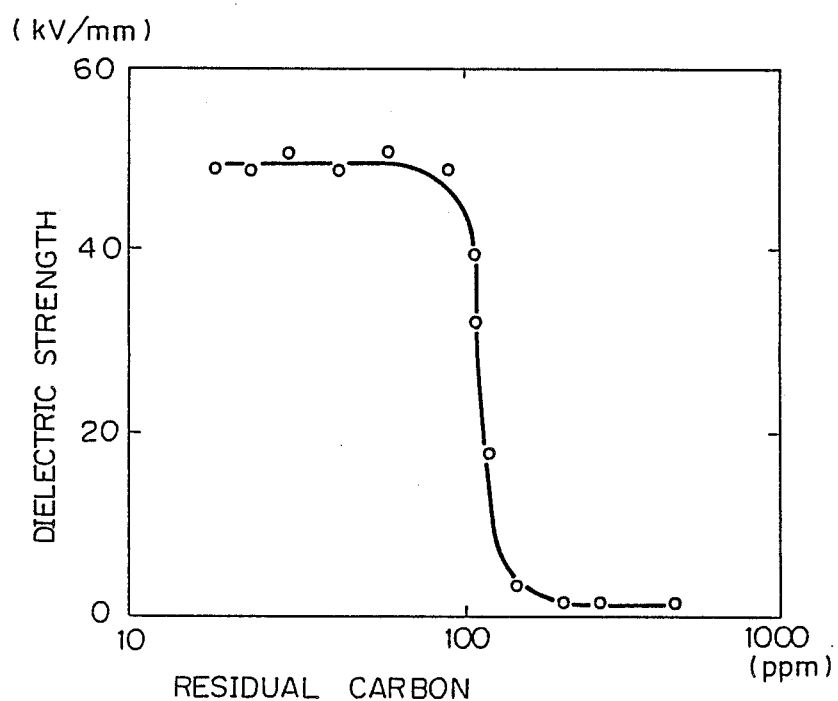

Sample sheets of 50×50×2mm glass/ceramic composite of mullite, quartz glass, and borosilicate glass having various contents of residual carbon were produced. In accordance with JIS C2141, the breakdown voltage was determined, in which an electric potential was applied on opposite sides of a sample sheet, and increased in a ratio of 0.5 KV/sec until the insulation was destroyed. Then, the obtained breakdown voltage KV was divided by the thickness 2 mm, to obtain the dielectirc strength kv/mm. The dielectric strength is sharply reduced with a glass/ceramic composite having more than 100 ppm of residual carbon, as shown in FIG. 5.

EXAMPLE 5

Powder of 34 parts by weight of mullite (Taiheiyo Randamu K.K. 70 N 4000 F), 33 parts by weight of quartz glass (Corning 7913), and 33 parts by weight of borosilicate glass (Corning 7740) having a softening temperature of 821° C. was mixed to prepare a glass-ceramic mixture.

Ten parts by weight of polymethyl methacrylate as a binder, 5 parts by weight of dibutyl phthalate as a plasticizer, and 110 parts by weight of methyl ethyl ketone as a solvent were blended into the glass/ceramic mixture in a ball mill, to prepare a uniform glass/ceramic composite composition. A green sheet 300 μm thick was formed by the doctor-blade technique and stamped to form 150 mm square sheets in which through holes were also opened at the same time. A copper based paste was screen printed on the green sheets to form circuit patterns. Ten layers of the printed green sheets were sequentially laminated and pressed at 130° C. under 30 MPa.

This laminated structure was fired in a nitrogen atmosphere containing 0.07 atm of water vapor, at 400° C. for 4 hours as the first prefiring step, to thermally depolymerize polymethyl methacrylate and remove evaporable organic substances, and then the temperature was raised to 850° C. and held for 4 hours as the second prefiring step, to substantially eliminate the residual carbon. Then, the prefired glass/ceramic composite structure was finally fired in dry nitrogen at 1000° C. for 4 hours, to obtain a sintered glass/ceramic composite copper circuit board, the sheet resistivity of the copper conductor was 1.2 mΩ/□, which showed that copper was not oxidised during the firing.

Glass/ceramic composite samples produced in the same way as in Examples 1a and 2a, except that the composition of the glass/ceramic composite is the same as that of the glass/ceramic composite copper circuit board set forth above, exhibited a low dielectric constant of 4.6, and a thermal expansion coefficient of $3 \times 10^{-6}/°$ C., which is nearly equal to the $3.5 \times 10^{-6}/°$ C. of silicon chips to be mounted on the circuit board, and a bending strength of 200 MPa. The amount of residual carbon was 35 parts per million, which corresponds to a dielectric strength of 50 kv/mm.

We claim:

1. A multilayer ceramic copper circuit board comprising layers of copper conductor patterns and layer of a glass ∠ ceramic composite of 3% to 75% by weight of mullite, 25% to 97% by weight of borosilicate glass having a softening temperature of at least 720° C., and 0% to 72% by weight of quartz glass, based on the total weight of the glass ∠ ceramic composite, said glass ∠ ceramic composite being sintered, the amount of residual carbon being less than 100 ppm.

* * * * *